(12) United States Patent
Li

(10) Patent No.: US 11,923,376 B2
(45) Date of Patent: Mar. 5, 2024

(54) ELECTRONIC DEVICE

(71) Applicant: PanelSemi Corporation, New Taipei (TW)

(72) Inventor: Chin-Tang Li, Tainan (TW)

(73) Assignee: PANELSEMI CORPORATION, New Taipei (TW)

( * ) Notice: Subject to any disclaimer, the term of this patent is extended or adjusted under 35 U.S.C. 154(b) by 295 days.

(21) Appl. No.: 17/522,156

(22) Filed: Nov. 9, 2021

(65) Prior Publication Data

US 2022/0149081 A1 May 12, 2022

(30) Foreign Application Priority Data

Nov. 10, 2020 (TW) .................................. 109139215

(51) Int. Cl.
| | | |
|---|---|---|
| *H01L 27/12* | (2006.01) | |
| *G09G 3/20* | (2006.01) | |
| *H01L 23/528* | (2006.01) | |
| *H05K 1/11* | (2006.01) | |

(52) U.S. Cl.
CPC ............. *H01L 27/124* (2013.01); *G09G 3/20* (2013.01); *H01L 23/528* (2013.01); *H05K 1/118* (2013.01); *G09G 2310/0264* (2013.01)

(58) Field of Classification Search
CPC ......... H01L 27/124; G09G 3/20; H05K 1/118
USPC .................................................. 349/158, 187
See application file for complete search history.

(56) References Cited

U.S. PATENT DOCUMENTS

2020/0388636 A1* 12/2020 Yueh ..................... H01L 27/124

* cited by examiner

*Primary Examiner* — Charles S Chang
(74) *Attorney, Agent, or Firm* — Muncy, Geissler, Olds & Lowe. P.C.

(57) ABSTRACT

An electronic device includes a sustaining layer, multiple substrates, multiple photoelectric units, multiple signal layers, multiple driving structures, and a constraining structure. The substrates are arranged on a contact surface of the sustaining layer. A first end edge of at least one substrate approaches a first end edge of the sustaining layer, and a first side edge of one substrate is adjacent to a second side edge of another substrate. The photoelectric units are arranged on the first or/and second surfaces of the substrates. The signal layers are arranged on the substrates and electrically connected to the photoelectric units. The driving structures are electrically connected to the substrates and disposed close to the first or second end edge of the sustaining layer. The constraining structure constrains the first or second end edge of the sustaining layer, and at least one driving structure is accommodated in the constraining structure.

20 Claims, 8 Drawing Sheets

ELECTRONIC DEVICE

CROSS REFERENCE TO RELATED APPLICATIONS

This Non-provisional application claims priority under 35 U.S.C. § 119(a) on Patent Application No(s). 109139215 filed in Taiwan, Republic of China on Nov. 10, 2020, the entire contents of which are hereby incorporated by reference.

BACKGROUND

Technology Field

The present disclosure relates to an electronic device and, in particular, to an electronic device that can be manufactured by a flexible joint process.

Description of Related Art

In the conventional manufacturing process of electronic device (e.g. photoelectric device), a plurality of thin-film transistors (TFT) are formed on the substrate to obtain a TFT substrate to drive the corresponding photoelectric components. Regarding the LED display devices, if the manufacturer wants to fabricate products with different sizes or functions, it is needed to design different thin-film substrates with various manufacturing processes corresponding to the products with different sizes or functions individually. In addition, the expensive TFT manufacturing processes, photomasks, substrates, or/and materials are needed in these manufacturing processes. These limitations are disadvantaged to various product demands, and the application thereof is lack of flexibility.

SUMMARY

This disclosure provides an electronic device that can be applied to the application to easily manufacture products in different sizes by customers' demands in the manner of tiling flexibility.

One or more exemplary embodiment of this present disclosure provides an electronic device, which includes a sustaining layer, a plurality of substrates, a plurality of photoelectric units, a plurality of signal layers, a plurality of driving structures, and a constraining structure. The sustaining layer is defined with a first end edge, a second end edge opposite to the first end edge, a first side edge, a second side edge opposite to the first side edge, a contact surface, and a non-contact surface opposite to the contact surface. The substrates are arranged on the contact surface of the sustaining layer. Each of the substrates is defined with a first end edge, a second end edge opposite to the first end edge, a first side edge, a second side edge opposite to the first side edge, a first surface, and a second surface opposite to the first surface. The first end edge of at least one of the substrates approaches the first end edge of the sustaining layer, and the first side edge of one of the substrates is next to the second side edge of another one of the substrates. The photoelectric units are arranged on at least one of the first surfaces and the second surfaces of the substrates, and each photoelectric unit has a photoelectric element. The signal layers are arranged on the substrates and electrically connected to the photoelectric units. The driving structures are electrically connected to the substrates, and disposed close to the first end edge or the second end edge of the sustaining layer. The driving structures are electrically connected to the photoelectric units through the signal layers. The constraining structure constrains the first end edge or the second end edge of the sustaining layer, and at least one of the driving structures is accommodated in the constraining structure.

In one exemplary embodiment, the first end edge of each of the substrates approaches the first end edge of the sustaining layer, and the second end edge of each of the substrates approaches the second end edge of the sustaining layer.

In one exemplary embodiment, the electronic device is further defined with a plurality of substrate units, and each of the substrate units is composed of two substrates. In two adjacent substrate units, the first side edge of each substrate of one substrate unit is next to the second side edge of each substrate of the other substrate unit. In each substrate unit, the first end edge of a first one of the substrates approaches the first end edge of the sustaining layer, the first end edge of a second one of the substrates approaches the second end edge of the sustaining layer, and the second end edge of the first substrate is next to the second end edge of the second substrate.

In one exemplary embodiment, each substrate unit comprises two of the driving structures, and the two driving structures are arranged on the two substrates of the substrate unit. One of the two driving structures is close to the first end edge of the first substrate, and the other one of the two driving structures is close to the first end edge of the second substrate. One of the two driving structures is accommodated in the constraining structure.

In one exemplary embodiment, each substrate unit is composed of two or more of the substrates. In two adjacent substrate units, the first side edge of each substrate of one of the substrate units is next to the second side edge of each substrate of another one of the substrate units. In each substrate unit, the first end edge of one of the substrates approaches the first end edge of the sustaining layer, the second end edge of another one of the substrates approaches the second end edge of the sustaining layer, and the driving structures are arranged on the substrate units.

In one exemplary embodiment, each of the photoelectric units further comprises a carrier and a signal sublayer arranged on the carrier, and the photoelectric element is disposed on the carrier and electrically connected to the signal sublayer. In each substrate unit, the signal sublayer of one of the photoelectric units is electrically connected to the signal layers of the two adjacent substrates.

In one exemplary embodiment, the driving structures are disposed on the substrates, respectively. In each of the substrate units, each of the driving structures is connected to the first end edge or the second end edge of the corresponding substrate and extends to overlap with an adjacent one of the substrates; or each of the driving structures is connected and perpendicular to the first end edge or the second end edge of the corresponding substrate; or each of the driving structures is connected to the first end edge or the second end edge of the corresponding substrate and folded, with an angle, along a corner of the corresponding substrate.

In one exemplary embodiment, each of the photoelectric units further comprises a carrier and a signal sublayer arranged on the carrier, and the photoelectric element is disposed on the carrier and electrically connected to the signal sublayer.

In one exemplary embodiment, each of the carriers is a resilient board.

In one exemplary embodiment, the electronic device further comprises a plurality of active elements arranged on the substrates or the carriers, and the active elements are electrically connected to the photoelectric elements of the photoelectric units, respectively.

In one exemplary embodiment, each of the photoelectric units comprises two or more photoelectric elements.

In one exemplary embodiment, each of the substrates is a resilient substrate.

In one exemplary embodiment, each of the driving structures comprises a thin-film transistor, a silicon chip, or a non-silicon chip.

In one exemplary embodiment, the sustaining layer is a glass substrate, a resilient substrate or a protective film.

In one exemplary embodiment, the photoelectric element is disposed between the corresponding substrate and the sustaining layer.

In one exemplary embodiment, the constraining structure is a supporting base including an accommodating recess, and the second end edge of the sustaining layer is inserted into the accommodating recess.

In one exemplary embodiment, the constraining structure is a reel including an accommodating recess, and the first end edge of the sustaining layer is positioned in the accommodating recess.

In one exemplary embodiment, each of the substrates is defined with a width W and a length L, a number of the substrates arranged from the first side edge of the sustaining layer to the second side edge of the sustaining layer is N, a number of the substrates arranged from the first end edge of the sustaining layer to the second end edge of the sustaining layer is M, and $(M*L)/(N*W)=9/16$.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
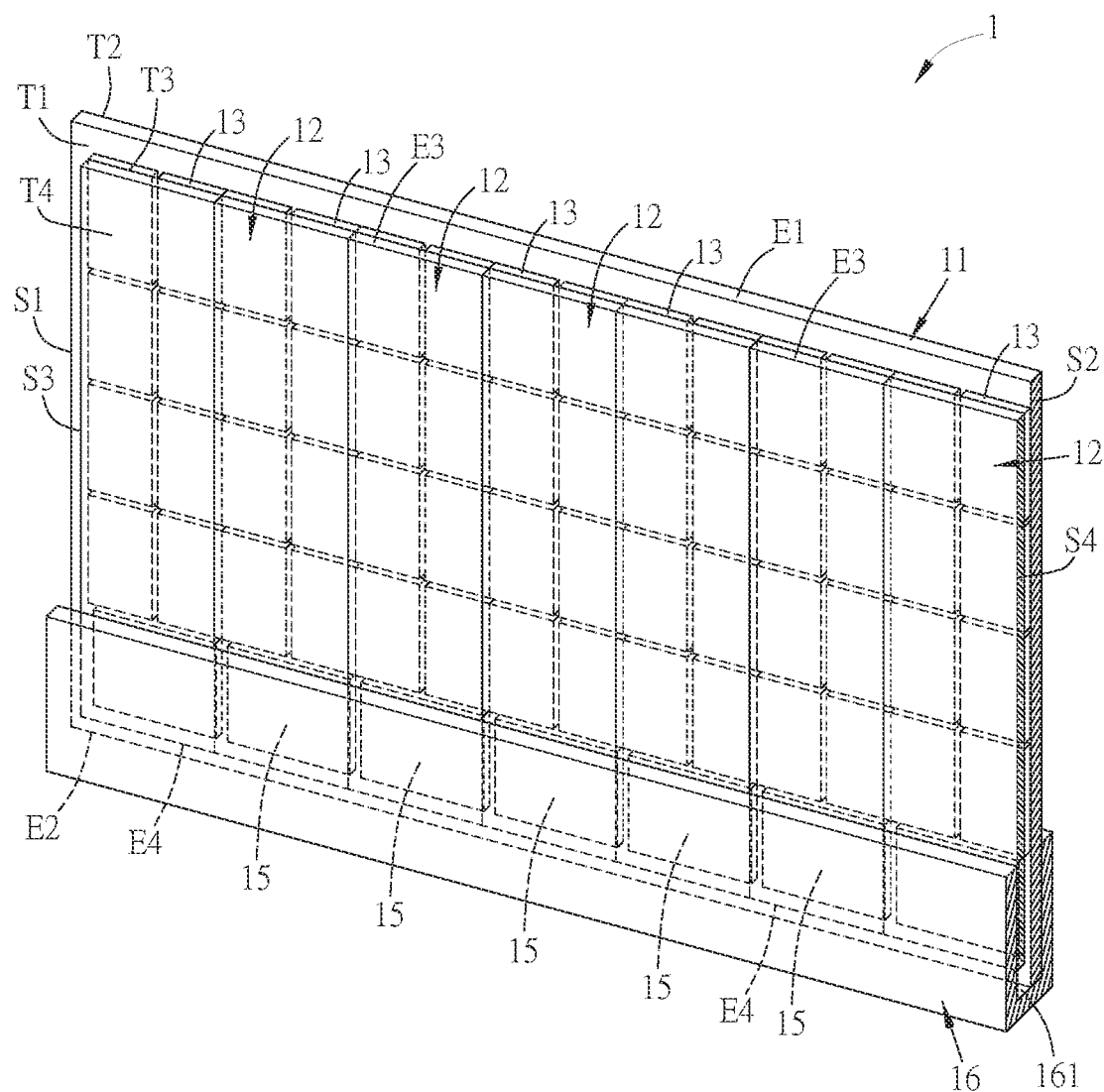
FIG. 1A is a schematic diagram showing an electronic device according to an embodiment of this disclosure.
Figure 1B:
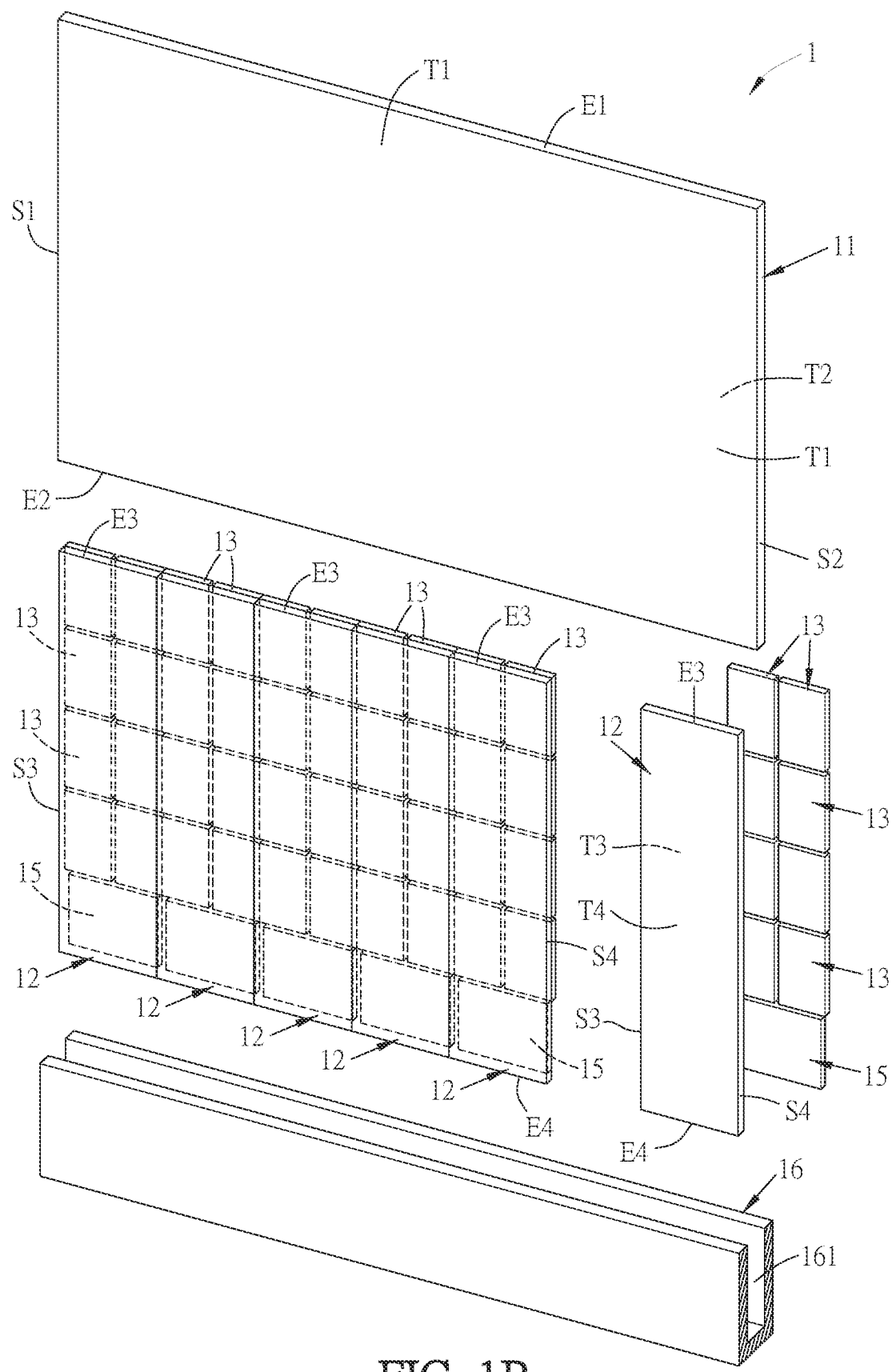
FIG. 1B is an exploded view of the electronic device of FIG. 1A.
Figure 1C:
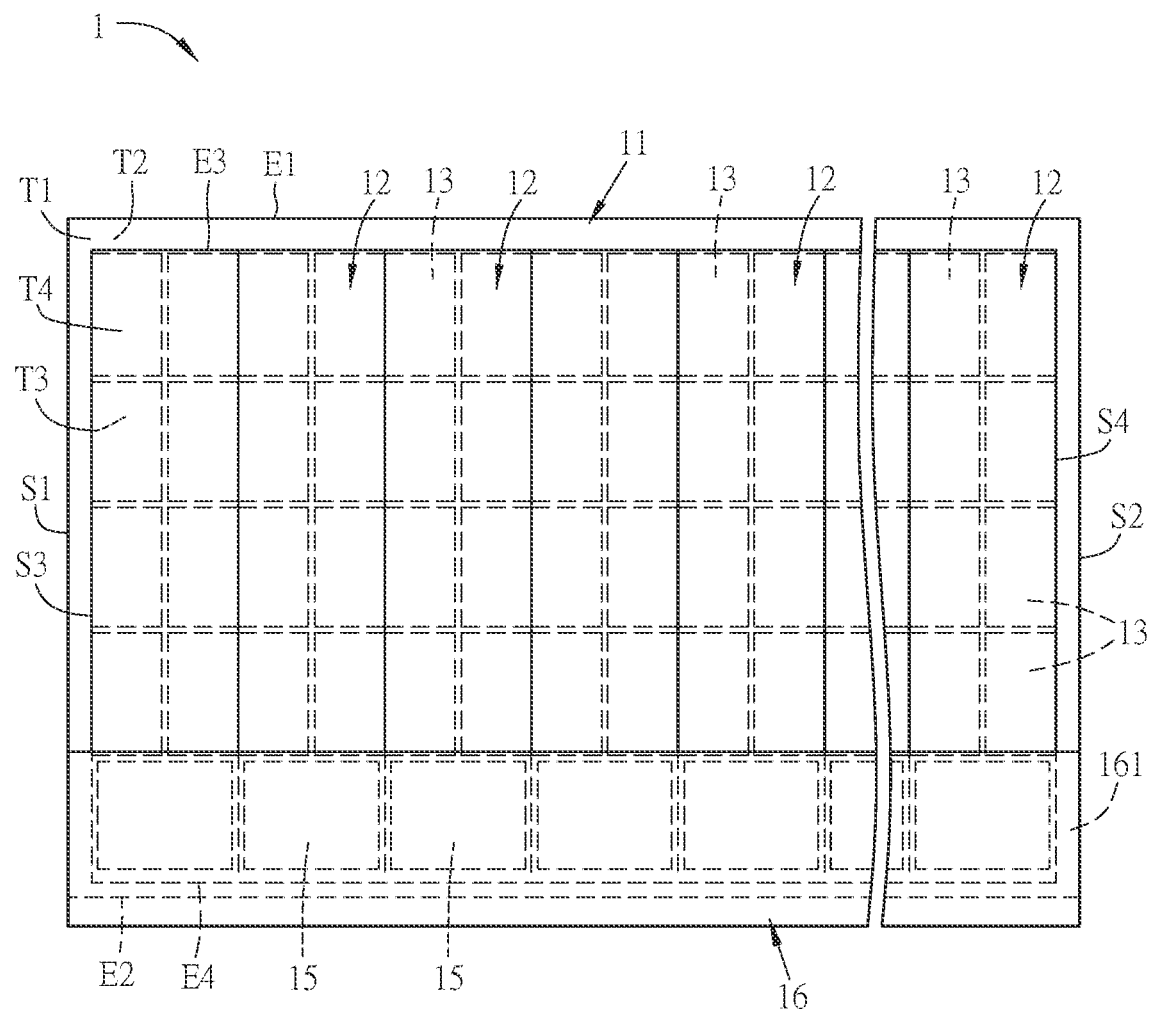
FIG. 1C is a front view of the electronic device of FIG. 1A.

FIG. 1A is a schematic diagram showing an electronic device according to an embodiment of this disclosure, FIG. 1B is an exploded view of the electronic device of FIG. 1A, and FIG. 1C is a front view of the electronic device of FIG. 1A.

As shown in FIGS. 1A to 1C, the electronic device 1 of this embodiment comprises a sustaining layer 11, a plurality of substrates 12, a plurality of photoelectric units 13, a plurality of signal layers (not shown), a plurality of driving structures 15, and a constraining structure 16.

The sustaining layer 11 is defined with a first end edge E1, a second end edge E2 opposite to the first end edge E1, a first side edge S1, a second side edge S2 opposite to the first side edge S1, a contact surface T1, and a non-contact surface T2 opposite to the contact surface T1. In this embodiment, the first end edge E1 is the upper edge of the sustaining layer 11, the second end edge E2 is the lower edge of the sustaining layer 11, the first side edge S1 is the left edge of the sustaining layer 11, the second side edge S2 is the right edge of the sustaining layer 11, the contact surface T1 is the surface of the sustaining layer 11 facing and connecting the substrates 12, and the non-contact surface T2 is the surface of the sustaining layer 11 away from the substrates 12.

The substrates 12 are arranged on the contact surface T1 of the sustaining layer 11; to be noted, the wording "arranged on" including descriptions of "disposed and contact on an object in a direct or indirect manner". Each substrate 12 is defined with a first end edge E3, a second end edge E4 opposite to the first end edge E3, a first side edge S3, a second side edge S4 opposite to the first side edge S3, a first surface T3, and a second surface T4 opposite to the first surface T3. In this embodiment, the first end edge E3 is the upper edge of the substrate 12, the second end edge E4 is the lower edge of the substrate 12, the first side edge S3 is the left edge of the substrate 12, and the second side edge S4 is the right edge of the substrate 12. Accordingly, the first end edge E3 of each substrate 12 corresponds to the first end edge E1 of the sustaining layer 11, and the second end edge E4 of each substrate 12 corresponds to the second end edge E2 of the sustaining layer 11. In addition, the first surface T3 of each substrate 12 is the surface of the substrate 12 facing the sustaining layer 11, and the second surface T4 of each substrate 12 is the surface of the substrate 12 away from the sustaining layer 11. To be noted, this disclosure is not limited thereto. In different embodiments, the first surface T3 of each substrate 12 can be the surface of the substrate 12 away from the sustaining layer 11, and the second surface T4 of each substrate 12 can be the surface of the substrate 12 facing the sustaining layer 11.

The first end edge E3 of at least one of the substrates 12 approaches the first end edge E1 of the sustaining layer 11, and the first side edge S3 of one of the substrates 12 is next to the second side edge S4 of another one of the substrates 12. To be noted, the wording "next to" is described as "in or into a position immediately to one side of an object in distance", and the wording "approach" is described as "come near or nearer to an object in distance". In this embodiment, each substrate 12 is a strip-type substrate, wherein the first end edge E3 of each substrate 12 approaches the first end edge E1 of the sustaining layer 11, the second end edge E4 of each substrate 12 approaches the second end edge E2 of the sustaining layer 11, and the side edges of the substrates 12 are connected to one another. In this case, "the side edges of the substrates 12 are connected to one another" means that the second side edge S4 of one substrate 12 (a first substrate 12) connects to the first side edge S3 of another substrate 12 (a second substrate 12 located at the right side of the first substrate 12), and the first side edge S3 of the first substrate 12 connects to the second side edge S4 of yet another substrate 12 (a third substrate 12 located at the left side of the first substrate 12), so that the substrates 12 can be closely jointed in a row to form a large substrate. This flexible joint process allows to fabricate the electronic product in the size meeting the custom's demands. To be noted, in the electronic device 1 of this embodiment, two adjacent substrates connected in a lateral relationship can be not electrically connected to each other.

In some embodiments, one or ones of the sustaining layer 11 and each substrate 12 can be a rigid substrate, a resilient substrate, or a combination thereof (e.g. a structure including stacked rigid and resilient substrates). The rigid substrate can be, for example but not limited to, a glass substrate, and the resilient substrate can be, for example but not limited to, a PI (polyimide) substrate. In some embodiments, the sustaining layer 11 can be a protective film or any functional film formed on the substrates 12, but this disclosure is not limited thereto. In this embodiment, for example, the sustaining layer 11 of the electronic device 1 is a glass substrate, and each substrate 12 is a PI substrate.

The photoelectric units 13 are arranged on one or both of the first surfaces T3 and the second surfaces T4 of each of the substrates 12. In other words, the photoelectric units 13 are arranged on either one or both of the first surface T3 and the second surface T4 of each substrate 12. In other words, the photoelectric units 13 are arranged on the first surface T3 or/and the second surface T4 of each substrate 12. Each photoelectric unit 13 has at least one photoelectric element (one or more than one photoelectric elements, not shown). In this embodiment, for example, the first surface T3 of each substrate 12 facing the sustaining layer 11 is arranged with multiple photoelectric units 13 (for example but not limited to 8 photoelectric units 13). Since the photoelectric elements of each photoelectric unit 13 are located between each substrate 12 and the sustaining layer 11, and in this case the photoelectric elements emit light toward the sustaining layer 11, the non-contact surface T2 of the sustaining layer 11 can function as the display surface of the electronic device 1.

Specifically, the photoelectric units 13 (the photoelectric elements) of this embodiment are disposed between the substrates 12 and the sustaining layer 11, so that the sustaining layer 11 can function as not only a supporting substrate (a rigid board) for the photoelectric units 13 and the substrates 12, but also a protective cover (e.g. a front cover) for protecting the photoelectric units 13. This configuration can protect the photoelectric units 13 from the invasion and damage of the external objects. In different embodiments, these photoelectric units 13 can also be arranged on the second surfaces T4 of the substrates 12 or on both surfaces (including the first surfaces T3 and the second surfaces T4) of the substrates 12, and this disclosure is not limited thereto. When the photoelectric units 13 are arranged on either the first surfaces T3 or the second surfaces T4 of the substrates 12, the electronic device 1 can be a photoelectric device with single-surface light-emitting function. When the photoelectric units 13 are arranged on either the first surfaces T3 or the second surfaces T4 of the substrates 12, the electronic device 1 can be a photoelectric device with dual-surface light-emitting function by modifying the light-emitting directions of the photoelectric elements. When the photoelectric units 13 are arranged on the first surfaces T3 and the second surfaces T4 of the substrates 12, the electronic device 1 can be a photoelectric device with dual-surface light-emitting function.

In some embodiments, the ratio of the lateral width of the substrate 12 to the lateral width of the photoelectric unit 13 can be equal to or greater than 1, and the ratio of the lateral width of the sustaining layer 11 to the lateral width of the substrate can also be equal to or greater than 1. To be noted, the "lateral width" indicates the width in the horizontal direction of FIG. 1C. Each substrate 12 can be defined with a width W and a length L. The number of the substrates 12 arranged from the first end edge S1 of the sustaining layer 11 to the second end edge S2 of the sustaining layer 11 is N, and the number of the substrates 12 arranged from the first end edge E1 of the sustaining layer 11 to the second end edge E2 of the sustaining layer 11 is M. In some embodiments, (M*L)/(N*W)=9/16. Referring to FIG. 1C, the above-mentioned "width" can be the lateral width (in horizontal direction), and the above-mentioned "length" can be the elongation length (in elongation direction). To be understood that "(M*L)/(N*W)=9/16" is an illustration only, and the electronic device 1 of this embodiment can be fabricated in any customized size by the flexible joint process. In other words, the manufacturing process of the electronic device 1 of this embodiment is very easy and simple, and can be customized by the flexible joint process so as to meet the custom's demands (e.g. the products in different sizes). To be further understood, the wordings "elongation", "lateral", "width" and "length" are used for easy comprehension regarding the figures, but not imply any limitation on any direction.

In some embodiments, the photoelectric units 13 can be arranged in any suitable shape such as rectangle, long strip, polygon (e.g. quadrilateral), circle, ellipse or irregular shapes. In other embodiments, the photoelectric units 13 can be arranged in an array, and this disclosure is not limited thereto. In addition, the photoelectric element of each photoelectric unit 13 can be a self-luminous component such as, for example but not limited to, an LED chip, a Mini LED chip, a Micro LED chip or a package thereof, or a light-emitting chip or package of any size in millimeters, micrometers or smaller. Herein, the millimeter-level package may include a micron-level chip, or the micron-level package may include a nanometer-level chip. The above-mentioned chip may be a die with horizontal electrodes, flip-chip electrodes, or vertical electrodes, which can be electrically connected to the circuit layer arranged on the substrate 12 by wire bonding or flip-chip bonding. The aforementioned package is not limited to a package containing with active components or a passive package without active components. Herein, the active component can be, for example but not limited to, a thin-film transistor (TFT), a silicon IC or a non-silicon IC.

The signal layers are arranged on the substrates 12 and electrically connected to the photoelectric units 13. In some embodiments, the signal layers can be arranged on one of the first surface T3 and the second surface T4 of each substrate 12, or on both of the first surface T3 and the second surface T4 of each substrate 12. In addition, the signal layers can also be disposed inside the substrates 12. The arrangement of the signal layers depends on the design and requirement, and this disclosure is not limited thereto. In some embodiments, each substrate 12 can be formed with a corresponding signal layer such as, for example but not limited to, an AM (active matrix) signal layer, which is designed with active components, or a PM (passive matrix) signal layer.

The driving structures 15 are electrically connected to the substrates 12. In this embodiment, the driving structures 15 can be disposed close to the first end edge E1 or/and the second end edge E2 of the sustaining layer 11. In other words, the driving structures 15 is close to one or both of the first end edge E1 and the second end edge E2 of the sustaining layer 11. In other words, the driving structures 15 is close to at least one of the first end edge E1 and the second end edge E2 of the sustaining layer 11. The wording "close to" is described as "near to an object with little distance in and between". In addition, the driving structures 15 are electrically connected to the photoelectric units 13 through the signal layers for driving the photoelectric units 13. The driving structure 15 may be made of and comprise a driving component (e.g. TFT), a driving unit, a driving chip or chiplet (e.g. driving IC), or/and a driving circuit (not shown) for driving the corresponding photoelectric unit 13, thereby activating the photoelectric element on the corresponding substrate 12 to emit light. Herein, the driving component, driving unit, driving chip, or/and driving circuit includes, for example but not limited to, a silicon IC, and the manner of an electrical connection between the driving structures 15 and the substrates 12 is not limited. In some embodiments, each driving structure 15 may comprise at least one TFT or silicon chip. In some embodiments, the number of the driving structures 15 is identical to the number of the substrates 12 (i.e., one driving structure 15 drives all photoelectric units 13 on one corresponding substrate 12), so that each driving structure 15 can driving all of the photoelectric elements on the corresponding substrate 12. In other embodiments, one driving structure 15 may drive a part of the photoelectric units 13 on one corresponding substrate 12. In other embodiments, one driving structure 15 may drive one, ones or all of the photoelectric units 13 on multiple substrates 12. This disclosure is not limited thereto. In some embodiments, each driving structure 15 may include, besides the TFT, other thin-film components or circuits, such as thin-film resistor, thin-film capacitor, or insulation film.

Figure 2:
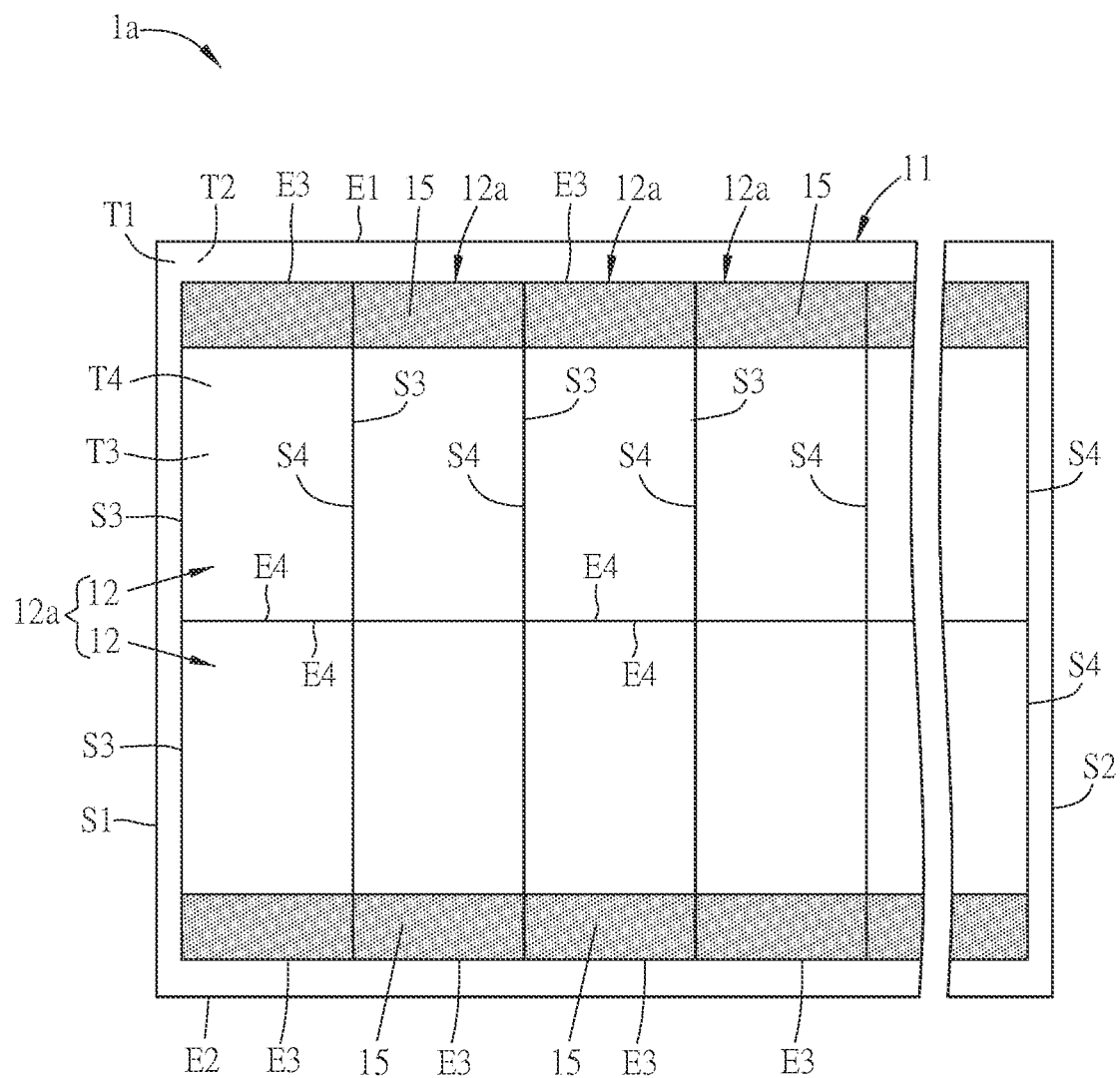
FIG. 2 and FIG. 3 are front views of the electronic devices according to different embodiments of this disclosure.
Figure 3:
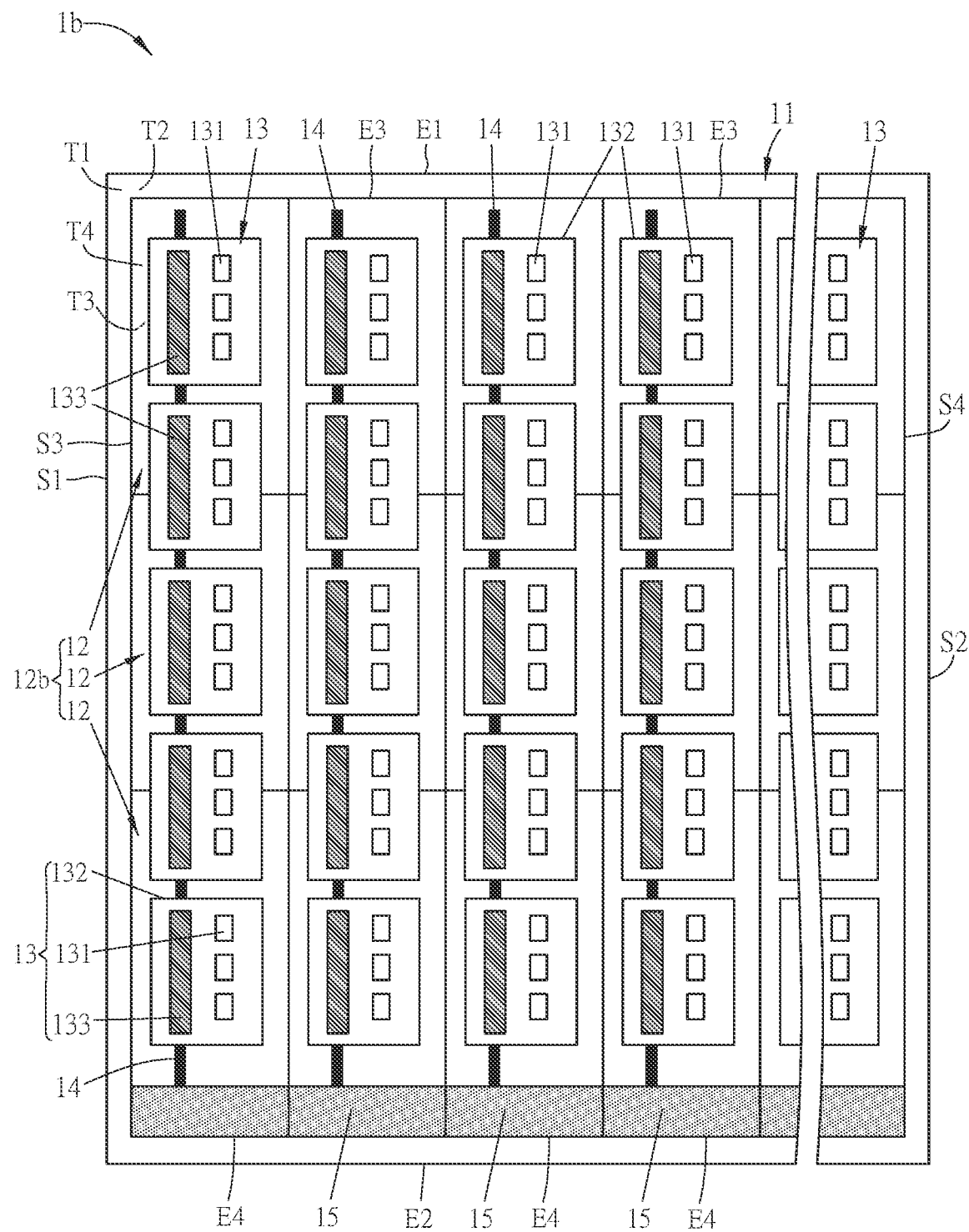

In this embodiment, each driving structure 15 is arranged on the corresponding substrate 12 close to the second end edge E2 of the sustaining layer 11, but this disclosure is not limited thereto. In different embodiments, each driving structure 15 can be arranged on the corresponding substrate 12 close to the first end edge E1 of the sustaining layer 11 (as shown in FIG. 5B). In different embodiments, some of the driving structures 15 are arranged on the corresponding substrates 12 close to the first end edge E1 of the sustaining layer 11, and some of the driving structures 15 are arranged on the corresponding substrates 12 close to the second end edge E2 of the sustaining layer 11 (as shown in FIGS. 2 and 3). In different embodiment, each driving structure 15 may be arranged on the sustaining layer 11. In different embodiments, each driving structure 15 may be an individual structure or disposed on an additional substrate (e.g. a flexible or rigid substrate) as an individual structure, which is other than the corresponding substrate 12 or the sustaining layer 11, for electrically connecting to the corresponding substrate 12. This disclosure is not limited thereto.

The constraining structure 16 constrains the first end edge E1 or the second end edge E2 of the sustaining layer 11, and at least one of the driving structures 15 is accommodated in the constraining structure 16. The constraining structure 16 can be a supporting structure or an accommodating structure for at least one of the sustaining layer 11, the substrates 12, the signal layers, and the driving structures 15. In this embodiment, the constraining structure 16 constrains the second end edge E2 of the sustaining layer 11, and the driving structures 15 are all accommodated in the constraining structure 16, for example. The amount of the constraining structures 16 can be two or more for constraining the first end edge E1 and the second end edge E2 of the sustaining layer 11, respectively. In addition, the constraining structures 16 for constraining the first end edge E1 of the sustaining layer 11 and the constraining structures 16 for constraining the second end edge E2 of the sustaining layer 11 can be the same structures or different structures. In this embodiment, the constraining structure 16 is a supporting base including an accommodating recess 161, and the second end edge E2 of the sustaining layer 11 is inserted into the accommodating recess 161.

FIG. 2 and FIG. 3 are front views of the electronic devices according to different embodiments of this disclosure. To be noted, for the sake of simplification, the constraining structures of the electronic devices are not shown in FIGS. 2 and 3.

As shown in FIG. 2, the component configuration and connection of the electronic device 1a of this embodiment are mostly the same as those of the electronic device 1 of the above-mentioned embodiment. Unlike the electronic device 1, the electronic device 1a of this embodiment is further defined with a plurality of substrate units 12a, and each substrate unit 12a is composed of two of the substrates 12. In two adjacent substrate units 12a, the first side edge S3 of each substrate 12 of one substrate unit 12a is next to the second side edge S4 of each substrate 12 of the other substrate unit 12a. In this embodiment, two substrates 12 are jointed in the elongation direction so as to form one substrate unit 12a. In two adjacent substrate units 12a, for example, the first side edge S3 of each substrate 12 in the right substrate unit 12a is next to the second side edge S4 of each substrate 12 in the left substrate unit 12a. In other words, two substrates 12 in one substrate unit 12a are jointed in the elongation direction, and the substrates 12 in different substrate units 12a are (laterally) jointed in the horizontal direction.

In addition, in each substrate unit 12a, the first end edge E3 of one substrate (first substrate) 12 approaches the first end edge E1 of the sustaining layer 11, the first end edge E3 of another substrate (second substrate) 12 approaches the second end edge E2 of the sustaining layer 11, and the second end edge E4 of the first substrate 12 is next to the second end edge E4 of the second substrate 12. Specifically, in each substrate unit 12a, the first end edge E3 of the upper substrate 12 approaches the first end edge E1 of the sustaining layer 11, and the first end edge E3 of the lower substrate 12 approaches the second end edge E2 of the sustaining layer 11. In the same substrate unit 12a, the second end edge E4 of the upper substrate 12 is next to the second end edge E4 of the lower substrate 12.

In this embodiment, each substrate unit 12a comprises two driving structures 15, which are arranged on the substrates 12 of the substrate unit 12a, respectively, and each driving structure 15 drives the photoelectric elements on the corresponding substrate 12. In addition, in each substrate unit 12a, one of the two driving structures 15 (e.g. the upper driving structure 15) is close to the first end edge E3 of one substrate 12 (e.g. the upper substrate 12), and the other driving structure 15 (e.g. the lower driving structure 15) is close to the first end edge E3 of the other substrate 12 (e.g. the lower substrate 12). At least one of the two driving structures 15 (e.g. the lower driving structure 15) is accommodated in the constraining structure (not shown in FIG. 2, please refer to FIG. 1A or 1C).

As shown in FIG. 3, the component configuration and connection of the electronic device 1b of this embodiment are mostly the same as those of the electronic device 1a of the above-mentioned embodiment. Unlike the electronic device 1a, in the electronic device 1b of this embodiment, each substrate unit 12b is composed of two or more substrates 12. In this case, each substrate unit 12b is composed of three substrates 12, which are jointed in an elongation direction along the sustaining layer 11, and the second surfaces T4 of the substrates 12 of each substrate unit 12b away from the sustaining layer 11 are configured with a plurality of photoelectric units 13. In two adjacent substrate units 12b, the first side edge S3 of each substrate 12 of one substrate unit 12b is next to the second side edge S4 of each substrate 12 of another substrate unit 12b. For example, the first side edge S3 of each substrate 12 of the left substrate unit 12b is next to the second side edge S4 of each substrate 12 of the right substrate unit 12b. In each substrate unit 12b, the first end edge E3 of one substrate 12 approaches the first end edge E1 of the sustaining layer 11, the second end edge E4 of another substrate 12 approaches the second end edge E2 of the sustaining layer 11, and the driving structures 15 are arranged on the substrate units 12b. Specifically, in each substrate unit 12b of this embodiment, the first end edge E3 of the top substrate 12 approaches the first end edge E1 of the sustaining layer 11, the second end edge E4 of the bottom substrate 12 approaches the second end edge E2 of the sustaining layer 11, and the driving structures 15 are arranged at one side of the substrate units 12b approaching the second end edge E2 of the sustaining layer 11. In this embodiment, one driving structure 15 drives the photoelectric units 13 on the corresponding substrate unit 12b.

In addition, a plurality of photoelectric units 13 (e.g. 5 photoelectric units 13 in this embodiment) are arranged on the substrates 12, which are jointed in the elongation direction, and one of the photoelectric units 13 straddles on two adjacent substrates 12 for example. In addition, each photoelectric unit 13 of the substrate unit 12b comprises a plurality photoelectric elements 131 (for example but not limited to 3), and further comprises a carrier 132 and a signal sublayer 133 arranged on the carrier 132. The photoelectric elements 131 are disposed on the carrier 132 and electrically connected to the signal sublayer 133. Accordingly, the signals for driving the photoelectric elements 131 can be transmitted to the photoelectric elements 131 via the signal sublayer 133. In each substrate unit 12b, the signal sublayer 133 of one of the photoelectric units 13 is electrically connected to the signal layers of the two adjacent substrates 12. Accordingly, the signals for driving the corresponding photoelectric units 13 can be outputted from the driving structures 15 to the photoelectric elements 131 via the signal layers 14 of the corresponding substrates 12 and the signal sublayers 133 of the corresponding carriers 132. Then, the photoelectric elements 131 can be activated to emit light. In some embodiments, each carrier 132 is a resilient board. Of course, in other embodiments, each carrier 132 can be a rigid board. To be understood, the photoelectric elements 131 of each photoelectric unit 13 of this embodiment can be directly disposed on the corresponding substrate 12, or be electrically connected to the corresponding substrate 12 via the carrier 132. This disclosure is not limited thereto.

In this embodiment, each substrate unit 12b includes five photoelectric units 13, and each photoelectric unit 13 includes three photoelectric elements 131. However, this disclosure is not limited thereto. In other embodiments, in each substrate unit 12b, the number of the photoelectric units 13 can be less than or greater than 5, and the number of the photoelectric elements 131 can be less than or greater than 3. In addition, two of the five photoelectric units 13 straddle on two adjacent substrates 12 in the elongation direction.

In some embodiments, the electronic device 1b can further comprises a plurality of active components (not shown), and the active components are arranged on the substrates 12 of the substrate units 12b or the carriers 132 of each photoelectric unit 13. This disclosure is not limited thereto. Herein, the active components can be electrically connected to the photoelectric elements 131 of the photoelectric units 13 individually, so that the active components can drive the photoelectric elements 131 of the photoelectric units 13. In this embodiment, the active component can be, for example but not limited to, a TFT, a silicon IC or a non-silicon IC.

Figure 4A:
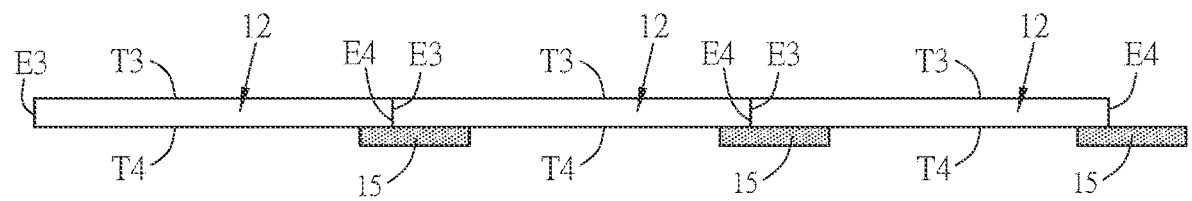
FIGS. 4A to 4C are schematic diagrams showing the arrangements of the corresponding substrates and driving structures according to different embodiments of this disclosure.
Figure 4B:
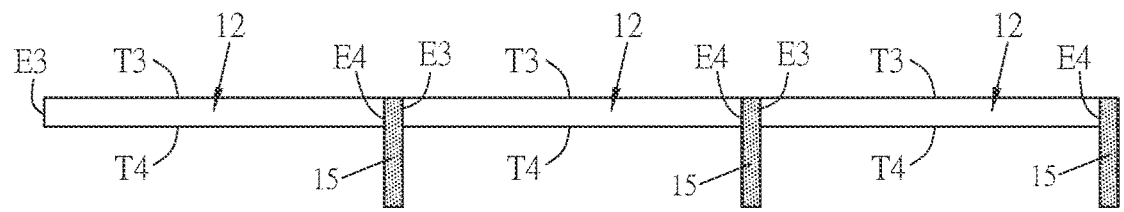
Figure 4C:
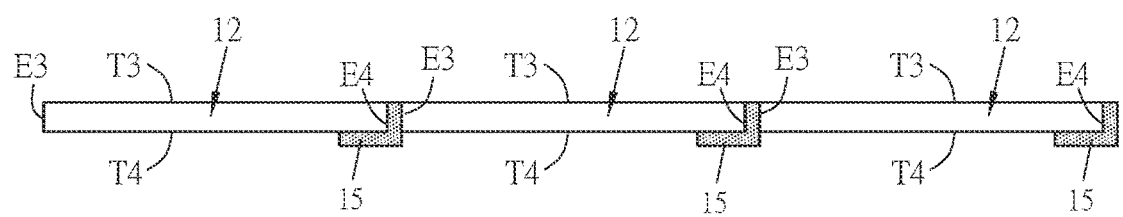

FIGS. 4A to 4C are schematic diagrams showing the arrangements of the corresponding substrates and driving structures according to different embodiments of this disclosure. The driving structures 15 can individually drive the substrates 12. For example, one driving structure 15 corresponds to one substrate 12. Therefore, this configuration is benefit to prevent the voltage drop of the driving signals of the driving structures 15 due to the large amount of jointed substrates 12 in one substrate unit, which may cause the poor driving phenomenon.

In some embodiments, in each substrate unit, each driving structure 15 is connected to the first end edge E3 or the second end edge E4 of the corresponding substrate 12 and extends to overlap with the adjacent substrate 12. As shown in FIG. 4A, each driving structure 15 of this embodiment is connected to the second end edge E4 of the corresponding substrate 12 and extends to overlap with the second surface T4 of the adjacent substrate 12. In this case, the sustaining layer 11 is disposed on the first surfaces T3 of the substrates 12.

In some embodiments, when each driving structure 15 comprises a rigid substrate, each driving structure 15 can be side connected with the first end edge E3 or the second end edge E4 of the corresponding substrate 12. As shown in FIG. 4B, each driving structure 15 of this embodiment is connected and perpendicular to the second end edge E4 of the corresponding substrate 12, and the sustaining layer 11 is disposed on the first surfaces T3 of the substrates 12.

In some embodiments, when each driving structure 15 comprises a resilient substrate, each driving structure 15 is connected to the first end edge E3 or the second end edge E4 of the corresponding substrate 12 and folded along a corner of the corresponding substrate 12. As shown in FIG. 4C, each driving structure 15 of this embodiment is connected to the second end edge E4 of the corresponding substrate 12 and folded, with an angle (e.g. 90°), along the corner of the corresponding substrate 12, and the sustaining layer 11 is disposed on the first surfaces T3 of the substrates 12.

To be understood, the above-mentioned driving structure 15 can extend from the first surface T3 or the second surface T4 of the corresponding substrate 12, and this disclosure is not limited thereto. Regarding the cases as shown in FIGS. 4A to 4C, the sustaining layer 11 can be disposed on the second surfaces T4 of the substrates 12, and the sustaining layer 11 may be configured with an opening for accommodating the driving structures 15 or allowing the driving structures 15 to pass through. In this case, the non-contact surface of the sustaining layer 11 can be defined as a display surface or non-display surface of the electronic device 1.

Figure 5A:
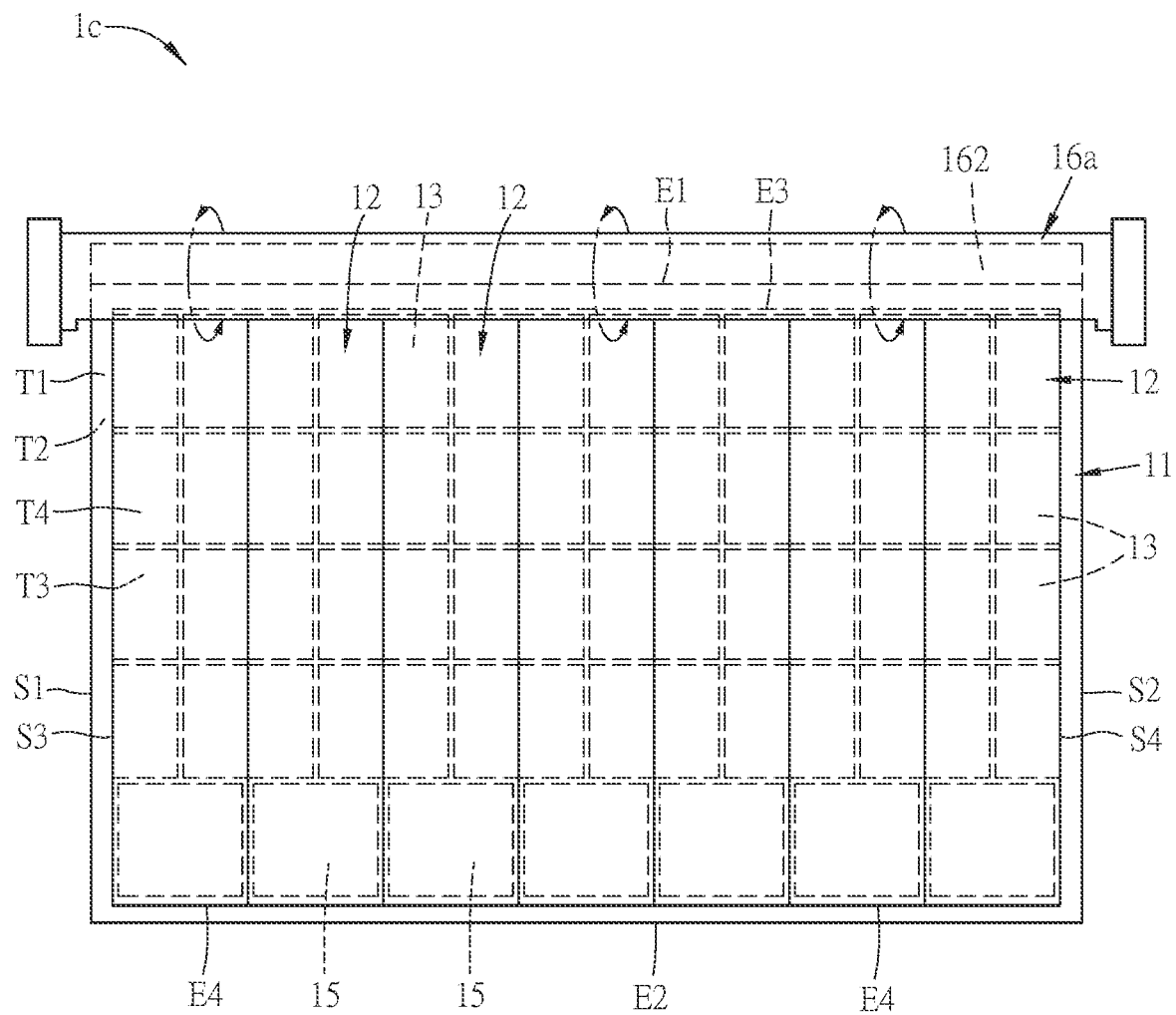
FIGS. 5A and 5B are front views of the electronic devices according to different embodiments of this disclosure.
Figure 5B:
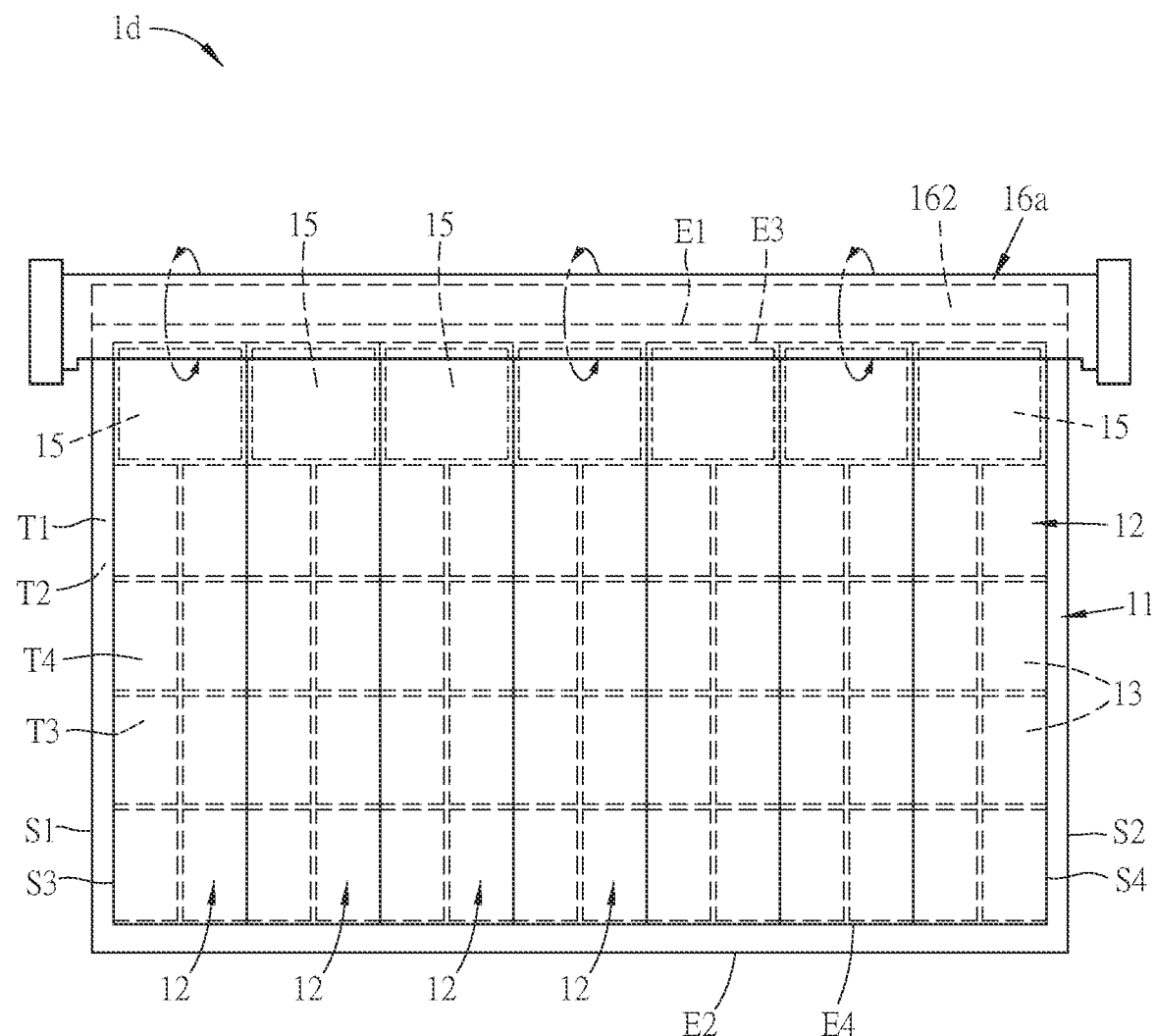

FIGS. 5A and 5B are front views of the electronic devices according to different embodiments of this disclosure. As shown in FIG. 5A, the component configuration and connection of the electronic device 1c of this embodiment are mostly the same as those of the electronic device 1 of the above-mentioned embodiment. Unlike the electronic device 1, the constraining structure 16a of the electronic device 1c is a reel including an accommodating recess 162, and the first end edge E1 of the sustaining layer 11 is positioned in the accommodating recess 162. When the sustaining layer 11 is a resilient board or a protective film, and the substrates 12, the photoelectric units 13 and the driving structures 15 all comprise resilient boards, the sustaining layer 11, the substrates 12, the photoelectric units 13 and the driving structures 15 can be scrolled in the direction from the second end edge E2 of the sustaining layer 11 to the accommodating recess 162 (like a roller blind) and then kept in the accommodating recess 162. This function can reduce the occupied space of the electronic device and thus make the storage thereof more convenient.

As shown in FIG. 5B, the driving structures 15 of this embodiment approach the first end edge E1 of the sustaining layer 11, so that the driving structures 15 can be normally accommodated in the reel. It can be understood that although a single constraining structure is used to constrain either one of the first end edge E1 and the second end edge E2 of the sustaining layer 11, and two constraining structures can be also implemented with same or different types for both end edges of the sustaining layer 11. In some embodiments, different types of two constraining structures can be also implemented simultaneously on the first end edge E1 and the second end edge E2 of the sustaining layer 11. For example, the constraining structure for the first end edge E1 can be provided with a support base, while the constraining structure for the second end edge E2 can be provided with a reel. In different embodiments, the same type of two constraining structures can be implemented simultaneously on the first end edge E1 and the second end edge E2 of the sustaining layer 11. For example, the constraining structures for the first end edge E1 and the second end edge E2 are both reels.

In summary, the electronic device of this disclosure comprises a sustaining layer, a plurality of substrates, a plurality of photoelectric units, a plurality of signal layers, a plurality of driving structures, and a constraining structure. Due to the configuration, connection and relationship of these components, the electronic device of this disclosure can be customized based on the demands of users, thereby fabricating the electronic product in the size meeting the custom's demands by the flexible joint process.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
    a sustaining layer defined with a first end edge, a second end edge opposite to the first end edge, a first side edge, a second side edge opposite to the first side edge, a contact surface, and a non-contact surface opposite to the contact surface;
    a plurality of substrates arranged on the contact surface of the sustaining layer, wherein each of the substrates is defined with a first end edge, a second end edge opposite to the first end edge, a first side edge, a second side edge opposite to the first side edge, a first surface, and a second surface opposite to the first surface; the first end edge of at least one of the substrates approaches the first end edge of the sustaining layer, and the first side edge of one of the substrates is next to the second side edge of another one of the substrates;
    a plurality of photoelectric units arranged on one or both of the first surface and the second surface of each of the substrates, wherein each of the photoelectric units has a photoelectric element;
    a plurality of signal layers arranged on the substrates and electrically connected to the photoelectric units;
    a plurality of driving structures electrically connected to the substrates, wherein the driving structures are close to one or both of the first end edge and the second end edge of the sustaining layer, and electrically connected to the photoelectric units through the signal layers; and
    a constraining structure constraining the first end edge or the second end edge of the sustaining layer, wherein at least one of the driving structures is accommodated in the constraining structure.

2. The electronic device of claim 1, wherein the first end edge of each of the substrates approaches the first end edge of the sustaining layer, and the second end edge of each of the substrates approaches the second end edge of the sustaining layer.

3. The electronic device of claim 1, further defined with a plurality of substrate units;
    wherein, each of the substrate units is composed of two of the substrates;
    wherein, in adjacent two of the substrate units, the first side edge of each of the substrates of one of the substrate units is next to the second side edge of each of the substrates of the other one of the substrate units; and
    wherein, in each of the substrate units, the first end edge of a first one of the substrates approaches the first end edge of the sustaining layer, the first end edge of a second one of the substrates approaches the second end edge of the sustaining layer, and the second end edge of the first one of the substrates is next to the second end edge of the second one of the substrates.

4. The electronic device of claim 3,
    wherein, each of the substrate units comprises two of the driving structures, and the two driving structures are arranged on the two substrates; and
    wherein, one of the two driving structures is close to the first end edge of the first one of the substrates, the other one of the two driving structures is close to the first end edge of the second one of the substrates, and one of the two driving structures is accommodated in the constraining structure.

5. The electronic device of claim 1, further defined with a plurality of substrate units;
    wherein, each of the substrate units is composed of two or more of the substrates;
    wherein, in adjacent two of the substrate units, the first side edge of each of the substrates of one of the substrate units is next to the second side edge of each of the substrates of another one of the substrate units; and
    wherein, in each of the substrate units, the first end edge of one of the substrates approaches the first end edge of the sustaining layer, the second end edge of another one of the substrates approaches the second end edge of the sustaining layer, and the driving structures are arranged on the substrate units.

6. The electronic device of claim 5, wherein each of the photoelectric units further comprises a carrier, and a signal sublayer arranged on the carrier; the photoelectric element is disposed on the carrier and electrically connected to the signal sublayer; and in each of the substrate units, the signal sublayer of one of the photoelectric units is electrically connected to the signal layers of the two adjacent substrates.

7. The electronic device of claim 6, wherein each of the carriers is a resilient board.

8. The electronic device of claim 6, further comprising:
    a plurality of active elements arranged on the substrates or the carriers, wherein the active elements are electrically connected to the photoelectric elements of the photoelectric units.

9. The electronic device of claim 5, wherein the driving structures are disposed on the substrates, respectively; and wherein in each of the substrate units, each of the driving structures is connected to the first end edge or the second end edge of the corresponding substrate and extends to overlap with an adjacent one of the substrates; or each of the driving structures is connected and perpendicular to the first end edge or the second end edge of the corresponding substrate; or each of the driving structures is connected to the first end edge or the second end edge of the corresponding substrate and folded along a corner of the corresponding substrate.

10. The electronic device of claim 1, wherein each of the photoelectric units further comprises a carrier, and a signal sublayer arranged on the carrier; the photoelectric element is disposed on the carrier and electrically connected to the signal sublayer.

11. The electronic device of claim 10, wherein each of the carriers is a resilient board.

12. The electronic device of claim 10, further comprising:
a plurality of active elements arranged on the substrates or the carriers, wherein the active elements are electrically connected to the photoelectric elements of the photoelectric units.

13. The electronic device of claim 1, wherein each of the photoelectric units comprises more than one of the photoelectric elements.

14. The electronic device of claim 1, wherein each of the substrates is a resilient substrate.

15. The electronic device of claim 1, wherein each of the driving structures comprises a thin-film transistor, a silicon chip, or a non-silicon chip.

16. The electronic device of claim 1, wherein the sustaining layer is a glass substrate, a resilient substrate or a protective film.

17. The electronic device of claim 1, wherein the photoelectric element is disposed between the corresponding substrate and the sustaining layer.

18. The electronic device of claim 1, wherein the constraining structure is a supporting base including an accommodating recess, and the second end edge of the sustaining layer is inserted into the accommodating recess.

19. The electronic device of claim 1, wherein the constraining structure is a reel including an accommodating recess, and the first end edge of the sustaining layer is positioned in the accommodating recess.

20. The electronic device of claim 1, wherein each of the substrates is defined with a width W and a length L, a number of the substrates arranged from the first side edge of the sustaining layer to the second side edge of the sustaining layer is N, a number of the substrates arranged from the first end edge of the sustaining layer to the second end edge of the sustaining layer is M, and $(M*L)/(N*W)=9/16$.

* * * * *